United States Patent
Smith et al.

(10) Patent No.: US 7,465,967 B2
(45) Date of Patent: Dec. 16, 2008

(54) GROUP III NITRIDE FIELD EFFECT TRANSISTORS (FETS) CAPABLE OF WITHSTANDING HIGH TEMPERATURE REVERSE BIAS TEST CONDITIONS

(75) Inventors: Richard Peter Smith, Carrboro, NC (US); Scott T. Sheppard, Chapel Hill, NC (US); Adam William Saxler, Durham, NC (US); Yifeng Wu, Goleta, CA (US)

(73) Assignee: Cree, Inc., Durham, NC (US)

( * ) Notice: Subject to any disclaimer, the term of this patent is extended or adjusted under 35 U.S.C. 154(b) by 389 days.

(21) Appl. No.: 11/080,905

(22) Filed: Mar. 15, 2005

(65) Prior Publication Data

US 2006/0208280 A1    Sep. 21, 2006

(51) Int. Cl.
*H01L 29/739* (2006.01)
*H01L 31/072* (2006.01)

(52) U.S. Cl. ...................... 257/194; 257/192

(58) Field of Classification Search .................. 257/12, 257/24, 27, 103, 190, 192, 194, 195, E21.295, 257/E21.399, E29.246, E29.249
See application file for complete search history.

(56) References Cited

U.S. PATENT DOCUMENTS

| | | | |
|---|---|---|---|
| 4,424,525 A | 1/1984 | Mimura | |
| 4,471,366 A | 9/1984 | Delagebeaudeuf et al. | |
| 4,727,403 A | 2/1988 | Hilda et al. | |
| 4,755,867 A | 7/1988 | Cheng | |
| 4,788,156 A | 11/1988 | Stoneham et al. | |
| 4,946,547 A | 8/1990 | Palmour et al. | |
| 5,053,348 A | 10/1991 | Mishra et al. | |
| 5,172,197 A | 12/1992 | Nguyen et al. | |
| 5,192,987 A | 3/1993 | Khan et al. | |
| 5,200,022 A | 4/1993 | Kong et al. | |
| 5,210,051 A | 5/1993 | Carter, Jr. | |
| 5,296,395 A | 3/1994 | Khan et al. | |
| 5,298,445 A | 3/1994 | Asano | |
| RE34,861 E | 2/1995 | Davis et al. | |
| 5,389,571 A | 2/1995 | Takeuchi et al. | |
| 5,393,993 A | 2/1995 | Edmond et al. | |
| 5,523,589 A | 6/1996 | Edmond et al. | |
| 5,534,462 A | 7/1996 | Fiordalice et al. | |

(Continued)

FOREIGN PATENT DOCUMENTS

EP    0 334 006 A1    9/1989

(Continued)

OTHER PUBLICATIONS

International Search Report and the Written Opinion, dated Oct. 6, 2006 for corresponding PCT application No. PCT/US2006/003259.

(Continued)

*Primary Examiner*—Hung Vu
(74) *Attorney, Agent, or Firm*—Myers Bigel Sibley & Sajovec

(57) ABSTRACT

Group III Nitride based field effect transistor (FETS) are provided having a power degradation of less than about 3.0 dB when operated at a drain-to-source voltage ($V_{DS}$) of about 56 volts, a gate to source voltage ($V_{gs}$) of from about −8 to about −14 volts and a temperature of about 140° C. for at least about 10 hours.

42 Claims, 3 Drawing Sheets

U.S. PATENT DOCUMENTS

| | | |
|---|---|---|
| 5,592,501 A | 1/1997 | Edmond et al. |
| 5,686,737 A | 11/1997 | Allen |
| 5,700,714 A | 12/1997 | Ogilhara et al. |
| 5,701,019 A | 12/1997 | Matsumoto et al. |
| 5,705,827 A | 1/1998 | Baba et al. |
| 5,804,482 A | 9/1998 | Konstantinov et al. |
| 5,885,860 A | 3/1999 | Weitzel et al. |
| 5,946,547 A | 8/1999 | Kim et al. |
| 5,990,531 A | 11/1999 | Taskar et al. |
| 6,028,328 A | 2/2000 | Riechert et al. |
| 6,046,464 A | 4/2000 | Schetzina |
| 6,051,849 A | 4/2000 | Davis et al. |
| 6,064,082 A | 5/2000 | Kawai et al. |
| 6,086,673 A | 7/2000 | Molnar |
| 6,150,680 A | 11/2000 | Eastman et al. |
| 6,177,685 B1 | 1/2001 | Teraguchi et al. |
| 6,177,688 B1 | 1/2001 | Linthicum et al. |
| 6,218,680 B1 | 4/2001 | Carter, Jr. et al. |
| 6,255,198 B1 | 7/2001 | Linthicum et al. |
| 6,261,929 B1 | 7/2001 | Gehrke et al. |
| 6,316,793 B1 | 11/2001 | Sheppard et al. |
| 6,376,339 B2 | 4/2002 | Linthicum et al. |
| 6,380,108 B1 | 4/2002 | Linthicum et al. |
| 6,429,467 B1 | 8/2002 | Ando |
| 6,448,648 B1 | 9/2002 | Boos |
| 6,462,355 B1 | 10/2002 | Linthicum et al. |
| 6,486,042 B2 | 11/2002 | Gehrke et al. |
| 6,489,221 B2 | 12/2002 | Gehrke et al. |
| 6,492,669 B2 | 12/2002 | Nakayama et al. |
| 6,515,316 B1 | 2/2003 | Wojtowicz et al. |
| 6,521,514 B1 | 2/2003 | Gehrke et al. |
| 6,545,300 B2 | 4/2003 | Gehrke et al. |
| 6,548,333 B2 | 4/2003 | Smith |
| 6,570,192 B1 | 5/2003 | Davis et al. |
| 6,582,906 B1 | 6/2003 | Cao et al. |
| 6,582,986 B2 | 6/2003 | Kong et al. |
| 6,586,778 B2 | 7/2003 | Linthicum et al. |
| 6,586,781 B2 | 7/2003 | Wu et al. |
| 6,602,763 B2 | 8/2003 | Davis et al. |
| 6,602,764 B2 | 8/2003 | Linthicum et al. |
| 6,608,327 B1 | 8/2003 | Davis et al. |
| 6,621,148 B2 | 9/2003 | Linthicum et al. |
| 6,639,255 B2 | 10/2003 | Inoue et al. |
| 6,686,261 B2 | 2/2004 | Gehrke et al. |
| 6,706,114 B2 | 3/2004 | Mueller |
| 6,841,001 B2 | 1/2005 | Saxler |
| 6,849,882 B2 | 2/2005 | Chavarkar et al. |
| 2001/0015446 A1 | 8/2001 | Inoue et al. |
| 2001/0020700 A1 | 9/2001 | Inoue et al. |
| 2001/0023964 A1 | 9/2001 | Wu et al. |
| 2001/0040246 A1 | 11/2001 | Ishii |
| 2002/0008241 A1 | 1/2002 | Edmond et al. |
| 2002/0017696 A1 | 2/2002 | Nakayama et al. |
| 2002/0066908 A1 | 6/2002 | Smith |
| 2002/0079508 A1 | 6/2002 | Yoshida |
| 2002/0119610 A1 | 8/2002 | Nishii et al. |
| 2002/0167023 A1 | 11/2002 | Charvarkar et al. |
| 2003/0017683 A1 | 1/2003 | Emrick et al. |
| 2003/0020092 A1 | 1/2003 | Parikh et al. |
| 2003/0102482 A1 | 6/2003 | Saxler |
| 2003/0123829 A1 | 7/2003 | Taylor |
| 2003/0145784 A1 | 8/2003 | Thompson et al. |
| 2003/0157776 A1 | 8/2003 | Smith |
| 2003/0213975 A1 | 11/2003 | Hirose et al. |
| 2004/0004223 A1 | 1/2004 | Nagahama et al. |
| 2004/0021152 A1 | 2/2004 | Nguyen et al. |
| 2004/0029330 A1 | 2/2004 | Hussain et al. |
| 2004/0061129 A1 | 4/2004 | Saxler et al. |
| 2004/0124435 A1 | 7/2004 | D'Evelyn et al. |
| 2004/0241970 A1 | 12/2004 | Ring |

FOREIGN PATENT DOCUMENTS

| | | |
|---|---|---|
| EP | 0 563 847 A2 | 10/1993 |
| JP | 10-050982 | 2/1998 |
| JP | 11261053 | 9/1999 |
| JP | 2001230407 A | 8/2001 |
| JP | 2002016087 A | 1/2002 |
| JP | 2004-342810 | 12/2004 |
| WO | WO 93/23877 A1 | 11/1993 |
| WO | WO 01/57929 A1 | 8/2001 |
| WO | WO 03/049193 A1 | 6/2003 |
| WO | WO 2004/008495 | 1/2004 |

OTHER PUBLICATIONS

Kunii T et al., *A high reliability GaN HEMT with SiN passivation by cat-CVD*, Compound Semiconductor Integrated Circuit Symposium, 2004, 2004 IEEE CSIC Digest, pp. 197-200.

Hansen P et al., *AlGaN/GaN metal-oxide-semiconductor heterostructure field-effect transistors using barium strontium titanate*, J. Vac. Sci. Technol. B 22(5), Sep./Oct. 2004, pp. 2479-2485.

Ambacher et al., "Two Dimensional Electron Gases Induced by Spontaneous and Piezoelectric Polarization Charges in N- and Ga-face AlGaN/GaN Heterostructures," *Journal of Applied Physics*. vol. 85, No. 6, pp. 3222-3233 (Mar. 1999).

Ando et al., "10-W/mm AlGaN-GaN HFET With a Field Modulating Plate," *IEEE Electron Device Letters*, 24(5), pp. 289-291 (May 2003).

Asbeck et al. "Piezoelectric charge densities in AlGaN/GaN HFETs," *Elecronics Letters*. vol. 33, No. 14, pp. 1230-1231 (1997).

Beaumont, B. et al., "Epitaxial Lateral Overgrowth of GaN," *Phys. Stat. Sol.* (b) 227, No. 1, pp. 1-43 (2001).

Ben-Yaacov et al., "AlGaN/GaN Current Aperture Vertical Electron Transistors with Regrown Channels," *Journal of Applied Physics*. vol. 95, No. 4, pp. 2073-2078 (2004).

Breitschadel et al. "Minimization of Leakage Current of Recessed Gate AlGaN/GaN HEMTs by Optimizing the Dry-Etching Process," *Journal of Electronic Materials*. vol. 28, No. 12, pp. 1420-1423 (1999).

Burm et al. "Recessed Gate GaN MODFETS," *Solid-State Electronics*. vol. 41, No. 2, pp. 247-250 (1997).

Burm et al. "Ultra-Low Resistive Ohmic Contacts on n-GaN Using Si Implantation," *Applied Physics Letters*. vol. 70, No. 4, 464-66 (1997).

Chang et al., "AlGaN/GaN Modulation-Doped Field-Effect Transistors with an Mg-doped Carrier Confinement Layer," *Jpn. J. Appl. Phys.*, 42:3316-3319 (2003).

Chen et al. "C12 reactive ion etching for gate recessing of AlGaN/GaN field-effect transistors," *J. Vac. Sci. Technol. B*. vol. 17, No. 6, pp. 2755-2758 (1999).

Chini et al., "Power and Linearity Characteristics of Field-Plagted Recessed-Gate AlGaN-GaN HEMTs," *IEEE Electron Device Letters*, 25(5), pp. 229-231 (May 2004).

Cho et al., "A New GaAs Field Effect Transistor (FET) with Dipole Barrier (DIB)," *Jpn. J. Appl. Phys.* 33:775-778 (1994).

Coffie et al., Unpassivated p-GaN/AlGaN/GaN HEMTs with 7.1 W/MMF at 10 GHz, *Electronic Letters online* No. 20030872, 39(19), (Sep. 18, 2003).

Eastman et al. "GaN materials for high power microwave amplifiers," *Mat. Res. Soc. Symp. Proc.* vol. 512 (1998).

Eastman et al. "Undoped AlGaN/GaN HEMTs for Microwave Power Amplification," *IEEE Transactions on Electron Devices*. vol. 48, No. 3, pp. 479-485 (Mar. 2001).

Egawa et al. "Recessed gate ALGaN/GaN MODFET on Sapphire Grown by MOCVD," *Applied Physics Letters*. vol. 76, No. 1, pp. 121-123 (Jan. 2000).

Gaska et al. "Electron Transport in AlGaN/GaN Heterostructures Grown on 6H-SiC Substrates," *Applied Physics Letters*. vol. 72, No. 6, pp. 707-709 (Feb. 1998).

Gaska et al. "High-Temperature Performance of AlGaN/GaN HFET's on SiC Substrates," *IEEE Electron Device Letters*. vol. 18, No. 1, pp. 492-494 (Oct. 1997).

Gaska et al., "Self-Heating in High-Power AlGaN/GaN HFET's," *IEEE Electron Device Letters*, 19(3), pp. 89-91 (Mar. 1998).

Gelmont et al. "Monte Carlo simulation of electron transport in gallium nitride," *Journal of Applied Physics*. vol. 74, No. 3, pp. 1818-1821 (Aug. 1993).

Heikman et al., "Growth of Fe-Doped Semi-insulating GaN by Metalorganic Chemical Vapor Deposition," *Applied Physics Letters*. vol. 83, No. 1, pp. 439-441 (Jul. 2002).

Heikman, et al., "Mass Transport Regrowth of GaN for Ohmic Contacts to AlGaN/GaN," *Applied Physics Letters*. vol. 78, No. 19, pp. 2876.

Heikman et al. "Polarization of Effects in AlGaN/GaN and GaN/AlGaN/GaN heterostructures," *Journal of Applied Physics*. vol. 93, No. 12, pp. 10114-10118 (Jun. 2003).

Heikman, Sten J., *MOCVD Growth Technologies for Applications in AlGaN/GaN High Electron Mobility Transistors*, Dissertation, University of California—Santa Barbara, Sep. 2002, 190 pages.

Hikita et al., "350V/150A AlGaN/GaN Power HFET on Silicon Substrate With Source-via Grouding (SVG) Structure," *Electron Devices Meeting*, 2004, pp. 803-806, IEDM Technical Digest. IEEE International (Dec. 2004).

Kanaev et al., "Femtosecond and Ultraviolet Laser Irradiation of Graphitelike Hexagonal Boron Nitride," *Journal of Applied Physics*, 96(8), pp. 4483-4489 (Oct. 15, 2004).

Kanamura et al., "A 100-W High-Gain AlGaN/GaN HEMT Power Amplifier on a Conductive N-SiC Substrate for Wireless Base Station Applications," *Electron Devices Meeting, 2004*, pp. 799-802, IEDM Technical Digest. IEEE International (Dec. 2004).

Karmalkar et al. "Enhancement of Breakdown Voltage in AlGaN/GaN High Electron Mobility Transistors Using a Field Plate," *IEEE Transactions on Electron Devices*. vol. 48, No. 8, pp. 1515-1521 (Aug. 2001).

Karmalkar et al. "Resurf AlGaN/GaN HEMT for High Voltage Power Switching," *IEEE Electron Device Letters*. vol. 22, No. 8, pp. 373-375 (Aug. 2001).

Karmalkar et al., "Very High Voltage AlGaN/GaN High Electron Mobility Transistors Using a Field Plate Deposited on a Stepped Insulator," *Solid State Electronics*, vol. 45, pp. 1645-1652 (2001).

Kasahara et al., "Ka-ban 2.3W Power AlGaN/GaN Heterojunction FET," *IEDM Technical Digest*, pp. 677-680 (2002).

Komiak et al., "Fully Monolithic 4 Watt High Efficiency Ka-band Power Amplifier," *IEEE MTT-S International Microwave Symposium Digest*, vol. 3, pp. 947-950 (1999).

Küsters et al., "Double-Heterojunction Lattice-Matched and Pseudomorphic InGaAs HEMT with δ-Doped InP Supply Layers and p-InP Barier Enhancement Layer Grown by LP-MOVPE," *IEEE Electron Device Letters*, 14(1), (Jan. 1993).

Kuzmik et al. "Annealing of Schottky contacts deposited on dry etched AlGaN/Gan," *Semiconductor Science and Technology*. vol. 17, No. 11 (Nov. 2002).

Manfra et al., "Electron Mobility Exceeding 160 000 $cm^2/V$ s in AlGaN/GaN Heterostructures Grown by Molecular-beam Epitaxy," *Applied Physics Letters*, 85(22), pp. 5394-5396 (Nov. 29, 2004).

Manfra et al., "High Mobility AlGaN/GaN Heterostructures Grown by Plasma-assisted Molecular beam epitaxy on Semi-Insulating GaN Templates Prepared by Hydride Vapor Phase Epitaxy," *Journal of Applied Physics*, 92(1), pp. 338-345 (Jul. 1, 2002).

Manfra et al., "High-Mobility AlGaN/GaN Heterostructures Grown by Molecular-beam Epitaxy on GaN Templates Prepared by Hydride Vapor Phase-Epitaxy," *Applied Physics Letters*, 77(18), pp. 2888-2890 (Oct. 30, 2000).

Neuburger et al. "Design of GaN-based Field Effect Transistor Structures based on Doping Screening of Polarization Fields," WA 1.5, 7th Wide-Gandgap III-Nitride Workshop (Mar. 2002).

Parikh et al., "Development of Gallium Nitride Epitaxy and Associated Material-Device Correlation for RF, Microwave and MM-wave Applications," Cree, Inc. (35 slides).

Ping et al. "DC and Microwave Performance of High-Current AlGan/GaN Heterostructure Field Effect Transistors Grown on p-Type SiC Substrates," *IEEE Electron Device Letters*. vol. 19, No. 2, pp. 54-56 (Feb. 1998).

Saxler et al., "III-Nitride Heterostructures on High-Purity Semi-Insulating 4H-SiC Substrates for High-Power RF Transistors," International Workshop on Nitride Semiconductors (Jul. 19, 2004).

Sheppard et al. "High Power Demonstration at 10 GHz with GaN/AlGaN HEMT Hybrid Amplifiers." Presented at the 58th DRC, Denver, CO, Jun. 2000.

Sheppard et al. "Improved 10-GHz Operation of GaN/AlGaN HEMTs on Silicon Carbide," *Materials Science Forum*. vols. 338-342, pp. 1643-1646, (2000).

Shen et al., "High-Power Polarization-Engineered GaN/AlGaN/GaN HEMTs Without Surface Passivation," *IEEE Electronics Device Letters*. vol. 25, No. 1, pp. 7-9 (2004).

Shiojima et al., "Improved Carrier Confinement by a Buried p-Layer in the AlGaN/GaN HEMT Structure," *IEICE Trans. Electron.*, E83-C(12), (Dec. 2000).

Sriram et al. "RF Performance of AlGaN/GaN MODFET's on High Resistivity SiC Substrates," Presentation at Materials Research Society Fall Symposium, 1997.

Sriram et al. "SiC and GaN Wide Bandgap Microwave Power Transistors," *IEEE Sarnoff Symposium*, Pittsburgh, PA, Mar. 18, 1998.

Sullivan et al. "High-Power 10-GHz Operation of AlGaN HFET's on Insulating SiC," *IEEE Electron Device Letters*. vol. 19, No. 6, pp. 198-200 (Jun. 1998).

"Thick AIN template on SiC substrate—Novel semi insulating substrate for GaN-based devices," © 2003 by TDI, Inc., http://www.tdii.com/products/AIN_SiCT.html.

Tilak et al., "Influence of Barrier Thickness on the High-Power Performance of AlGaN/GaN HEMTs," *IEEE Electron Device Letters*, 22(11), pp. 504-506 (Nov. 2001).

United States Patent Application entitled "Improved Dielectric Passivation for Semiconductor Devices," U.S. Appl. No. 10/851,507, filed May 22, 2004.

United States Patent Application entitled "Nitride-Based Transistors and Methods of Fabrication Thereof Using Non-Etched Contact Recesses," U.S. Appl. No. 10/617,843, filed Jul. 11, 2003.

United States Patent Application entitled "Nitride-Based Transistors with a Protective Layer and a Low-Damage Recess and Methods of Fabrication Thereof," U.S. Appl. No. 10/758,871, filed Jan. 16, 2004.

United States Patent Application entitled "Co-Doping for Fermi Level Control in Semi-Insulating Group III Nitrides," U.S. Appl. No. 10/752,970, filed Jan. 7, 2004.

United States Patent Application entitled "Cap Layers and/or Passivation Layers for Nitride-Based Transistors, Transistor Structures and Methods of Fabricating the Same," U.S. Appl. No. 10/996,249, filed Nov. 23, 2004.

United States Patent Application entitled "Method of Having Laterally Grown Active Region and Methods of Fabricating Same," U.S. Appl. No. 10/899,215, filed Jul. 26, 2004.

United States Patent Application entitled "Silicon Carbide on Diamond Substrates and Related Devices and Methods," U.S. Appl. No. 10/707,898, filed Jan. 22, 2004.

United States Patent Application entitled "Nitride Heterojunction Transistors Having Charge-Transfer Induced Energy Barriers and Methods of Fabricating the Same," U.S. Appl. No. 10/772,882, filed Feb. 5, 2004.

United States Patent Application entitled "Methods of Fabricating Nitride-Based Transistors with a Cap Layer and a Recessed Gate," U.S. Appl. No. 10/897,726, filed Jul. 23, 2004.

United States Patent Application entitled "Semiconductor Devices Having A Hybrid Channel Layer Current Aperture Transistors and Methods of Fabricating Same" U.S. Appl. No. 10/849,589, filed May 20, 2004.

United States Patent Application entitled "Methods of Fabricating Nitride-Based Transistors Having Regrown Ohmic Contact Regions and Nitride-Based Transistors Having Regrown Ohmic Contact Regions," U.S. Appl. No. 10/849,617, filed May 20, 2004.

United States Patent Application entitled "High Power Density and/or Linearity Transistors," U.S. Appl. No. 11/005,107, filed Dec. 6, 2004.

United States Patent Application entitled "Field Effect Transistors (FETS) Having Multi-Watt Output Power at Millimeter-Wave Frequencies," U.S. Appl. No. 11/005,423, filed Dec. 6, 2004.

United States Patent Application entitled "Aluminum Free Group III-Nitride Based High Electron Mobility Transistors and Methods of Fabricating Same," U.S. Appl. No. 11/118,575, filed Apr. 29, 2005.

United States Patent Application entitled "Binary Group III-Nitride Based High Electron Mobility Transistors and Methods of Fabricating Same," U.S. Appl. No. 11/118,675, filed Apr. 29, 2005.

United States Patent Application entitled "Composite Substrates of Conductive And Insulating or Semi-Insulating Group III-Nitrides For Group III-Nitride Devices," U.S. Appl. No. 11/103,127, filed Apr. 11, 2005.

United States Patent Application entitled "Thick Semi-Insulating or Insulating Epitaxial Gallium Nitride Layers and Devices Incorporating Same," U.S. Appl. No. 11/103,117, filed Apr. 11, 2005.

Walker, J. L. B. (Ed.), *High Power GaAs FET Amplifiers*, Norwood, MA: Artech House, pp. 119-120 (1993).

Wu et al., "3.5-Watt AlGaN/GaN HEMTs and Amplifiers at 35 GHz," IEDM-2003, Cree, Inc.

Wu et al., "3.5-Watt AlGaN/GaN HEMTs and Amplifiers at 35 GHz," Cree Santa Barbara Technology Center, Goleta, CA 93117.

Wu et al., "30-W/mm GaN HEMTs by Field Plate Optimization," *IEEE Electron Device Letters*, 25(3), pp. 117-119 (Mar. 2004).

Wu et al., "Bias-dependent Performance of High-Power AlGaN/GaN HEMTs," *IEDM Technical Digest*, p. 378-380 (2001).

Wu et al., "High Al-Content AlGaN/GaN MODFET's for Ultrahigh Performance," *IEEE Electron Device Letters*. vol. 19, No. 2, pp. 50-53 (Feb. 1998).

Wu et al., "Linearity Performance of GaN HEMTs With Field Plates," DRC 2004, Cree, Inc.

Wu et al., "Linearity Performance of GaN HEMTs With Field Plates," Cree Santa Barbara Technology Center, Goleta, CA 93117.

Yu et al., "Schottky Barrier Engineering in III-V Nitrides via the Piezoelectric Effect," *Applied Physics Letters*, 73(13), pp. 1880-1882 (Sep. 28, 1998).

Zhang et al., "High Breakdown GaN HEMT with Overlapping Gate Structure," *IEEE Electron Device Letters*, 21(9), pp. 421-423 (Sep. 2000).

US 7,465,967 B2

GROUP III NITRIDE FIELD EFFECT TRANSISTORS (FETS) CAPABLE OF WITHSTANDING HIGH TEMPERATURE REVERSE BIAS TEST CONDITIONS

STATEMENT OF GOVERNMENT INTEREST

The present invention was developed with Government support under contract numbers N00014-02-C-0306 and N00014-02-C-0321 awarded by the Department of the Navy. The Government has certain rights in this invention.

FIELD OF THE INVENTION

The present invention relates to semiconductor devices and, more particularly, to Group III-Nitride field effect transistors (FETs).

BACKGROUND

Materials such as silicon (Si) and gallium arsenide (GaAs) have found wide application in semiconductor devices for radio frequency (RF) applications. However, these, more familiar, semiconductor materials may not be well suited for higher power because of their relatively small bandgaps (e.g., 1.12 eV for Si and 1.42 for GaAs at room temperature) and/or relatively small breakdown voltages.

In light of the difficulties presented by Si and GaAs, interest in high power and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials, typically, have higher electric field breakdown strengths than gallium arsenide (GaN) and GaN typically has better electron transport properties than silicon.

A device of particular interest for high power and/or high frequency applications is the High Electron Mobility Transistor (HEMT), which, in certain cases, is also known as a modulation doped field effect transistor (MODFET). These devices may offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped ("unintentionally doped"), smaller bandgap material and can contain a very high sheet electron concentration in excess of, for example, $10^{13}$ carriers/cm$^2$. Unlike electrons in conventional bulk-doped devices, electrons in 2DEG may have higher mobilities due to reduced ion impurity scattering.

This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of the combination of material characteristics that includes the aforementioned high breakdown fields, their wide bandgaps, large conduction band offset, and/or high saturated electron drift velocity. A major portion of the electrons in the 2DEG is attributed to polarization in the AlGaN. HEMTs in the GaN/AlGaN system have already been demonstrated. U.S. Pat. Nos. 5,192,987 and 5,296,395 describe AlGaN/GaN HEMT structures and methods of manufacture.

U.S. Pat. No. 6,316,793, to Sheppard et al., which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

It is standard practice to screen RF power devices, for example, HEMTs, with high temperature, reverse bias (HTRB) tests as a part of the qualification procedures. The $V_{GS}$ used during HTRB tests may be at least as negative as $-2*(2-V_{GQ})$ or $-2*(2-V_T)$, whichever is more negative, where $V_{GQ}$ is the quiescent $V_{GS}$ for the target application and $V_T$ is the threshold voltage of the device. Both $VG_Q$ and $V_T$ are typically negative. In this case, both $VG_Q$ and $V_T$ are referenced to the maximum possible gate voltage, which is typically from about 1.0 to about 3.0 Volts. The $V_{DS}$ used during HTRB may be about $2*V_{DQ}$, where $V_{DQ}$ is the quiescent $V_{DS}$ for the target application. In particular, the power device may be subjected to the maximum reverse bias voltage that the device may instantaneously reach in a real application, with the temperature raised to normal operating temperature, for example, 140° C. Typically, tests are run for approximately 1000 hours.

SUMMARY OF THE INVENTION

Some embodiments of the present invention provide Group III Nitride based field effect transistor (FETs) having a power degradation of less than about 3.0 dB when operated at a drain-to-source voltage ($V_{DS}$) of about 56 volts, a gate to source voltage ($V_{gs}$) of from about −8 to about −14 volts and a temperature of about 140° C. for greater than about 10 hours.

In further embodiments of the present invention the FETs may have a power degradation of not greater than about 0.44 dB when operated at a $V_{DS}$ of about 56 volts, a $V_{gs}$ of about −8 volts and a temperature of about 140° C. for about 20 hours. The FETs may include a GaN channel layer having a thickness of about 2.0 μm. The FET may be a high electron mobility transistor (HEMT). The HEMT may further include an AlN layer on the GaN channel layer, an AlGaN layer on the AlN layer, a T-gate contact on the AlGaN layer, an insulating layer on a surface of the HEMT and source and drain contacts on the AlGaN layer. The FET may have a power density of greater than about 3.0 W/mm and operate at a frequency of from about 3.5 to about 4.0 GHz.

In still further embodiments of the present invention, the FETs may have a power degradation not greater than about 1.3 dB when operated at a $V_{DS}$ of about 56 volts, a $V_{gs}$ of about −8 volts and a temperature of about 140° C. for about 20 hours. The FET may include a GaN channel layer having a thickness of from about 2.0 μm to about 8.0 μm and all but about 1.0 μm of a surface of the GaN channel layer may be doped with Fe to a concentration of from about $2\times10^{16}$ cm$^{-3}$ to about $2\times10^{18}$ cm$^{-3}$. The FET may be a HEMT and the HEMT may include an AlN layer on the GaN channel layer, an AlGaN layer on the AlN layer, a T-gate contact on the AlGaN layer, an insulating layer on a surface of the HEMT and source and drain contacts on the AlGaN layer. The may have a power density of greater than about 3.0 W/mm operating at a frequency of from about 3.5 to about 4.0 GHz.

In some embodiments of the present invention, the FETs may have a power degradation of not greater than about 1.0 dB when operated at a $V_{DS}$ of about 56 volts, a $V_{gs}$ of about −8 volts and a temperature of about 140° C. for about 10 hours.

The FET may include a passivation layer on a surface of the FET and the passivation layer may include silicon nitride (SiN). The FET may be a HEMT. The HEMT may include a GaN channel layer, an AlN layer on the GaN channel layer, an AlGaN layer on the AlN layer, a T-gate contact on the AlGaN layer and source and drain contacts on the AlGaN layer, wherein the passivation layer is provided on the T-gate contact, the AlGaN layer and the source and drain contacts. The FET may have a power density of greater than about 3.0 W/mm and operate at a frequency of from about 3.5 to about 4.0 GHz.

In further embodiments of the present invention, the FET may have a power degradation of not greater than about 0.40 dB when operated at a $V_{DS}$ of about 56 volts, a $V_{gs}$ of from about −8 volts to about −14 volts and a temperature of about 140° C. for from about 10 to about 62 hours. The FET may include a GaN channel layer having a thickness of about 6.0 µm and all but about 1.0 µm of a surface of the GaN channel layer may be doped with Fe to a concentration of from about $2 \times 10^{16}$ cm$^{-3}$ to about $2 \times 10^{18}$ cm$^{-3}$. The FET may be a HEMT. The HEMT may include an AlN layer on the GaN channel layer, an AlGaN layer on the AlN layer, a T-gate contact on the AlGaN layer, an insulating layer on a surface of the HEMT and source and drain contacts on the AlGaN layer. The FET may have a power density of greater than about 3.0 W/mm and operate at a frequency of from about 3.5 to about 4.0 GHz.

In still further embodiments of the present invention, the FET may have a power degradation not greater than about 0.25 dB when operated at a $V_{DS}$ of about 56 volts, a $V_{gs}$ of about −8 volts to and a temperature of about 140° C. for about 10 hours. The FET may include a GaN channel layer having a thickness of about 6.0 µm and an AlGaN layer on the GaN channel layer, having from about 15 to about 30 percent Al and a thickness of from about 15 to about 40 nm. The FET may be a HEMT. The HEMT may include an AlN layer between the GaN channel layer and the AlGaN, a T-gate contact on the AlGaN layer, an insulating layer on a surface of the HEMT and source and drain contacts on the AlGaN layer. The FET may have a power density of greater than about 3.0 W/mm and operate at a frequency of from about 3.5 to about 4.0 GHz.

In some embodiments of the present invention, the FET may have a power degradation not greater than about 0.45 dB when operated at a $V_{DS}$ of from about 28 to about 70 volts, a $V_{gs}$ of about −3.3 to about −14 and a temperature of about 140° C. for about 6 to about 100 hours. The FET may include a GaN channel layer having a thickness of about 6.0 µm and all but about 1.0 µm of a surface of the GaN channel layer may be doped with Fe to a concentration of from about $2 \times 10^{16}$ cm$^{-3}$ to about $2 \times 10^{18}$ cm$^{-3}$. The FET may be a HEMT. The HEMT may include an AlN layer on the GaN channel layer, an AlGaN layer on the AlN layer, a T-gate contact on the AlGaN layer, an insulating layer on a surface of the HEMT and source and drain contacts on the AlGaN layer. The FET may have a power density of greater than about 3.0 W/mm and operate at a frequency of from about 3.5 to about 4.0 GHz.

Further embodiments of the present invention provide Group III Nitride based field effect transistors (FETs) capable of withstanding high temperature, reverse bias test conditions of a drain-to-source voltage ($V_{DS}$) of about 56 volts, a gate to source voltage ($V_{gs}$) of from about −8 to about −14 volts and a temperature of about 140° C. for at least about 10 hours.

Still further embodiments of the present invention provide high electron mobility transistors (HEMTs) having a power degradation of less than about 3.0 dB and a power density of greater than about 3.0 W/mm when operated at a drain-to-source voltage ($V_{DS}$) of about 56 volts, a gate to source voltage ($V_{gs}$) of from about −8 to about −14 volts and a temperature of about 140° C. for at least about 10 hours.

DETAILED DESCRIPTION OF EMBODIMENTS OF THE INVENTION

Figure 1A:
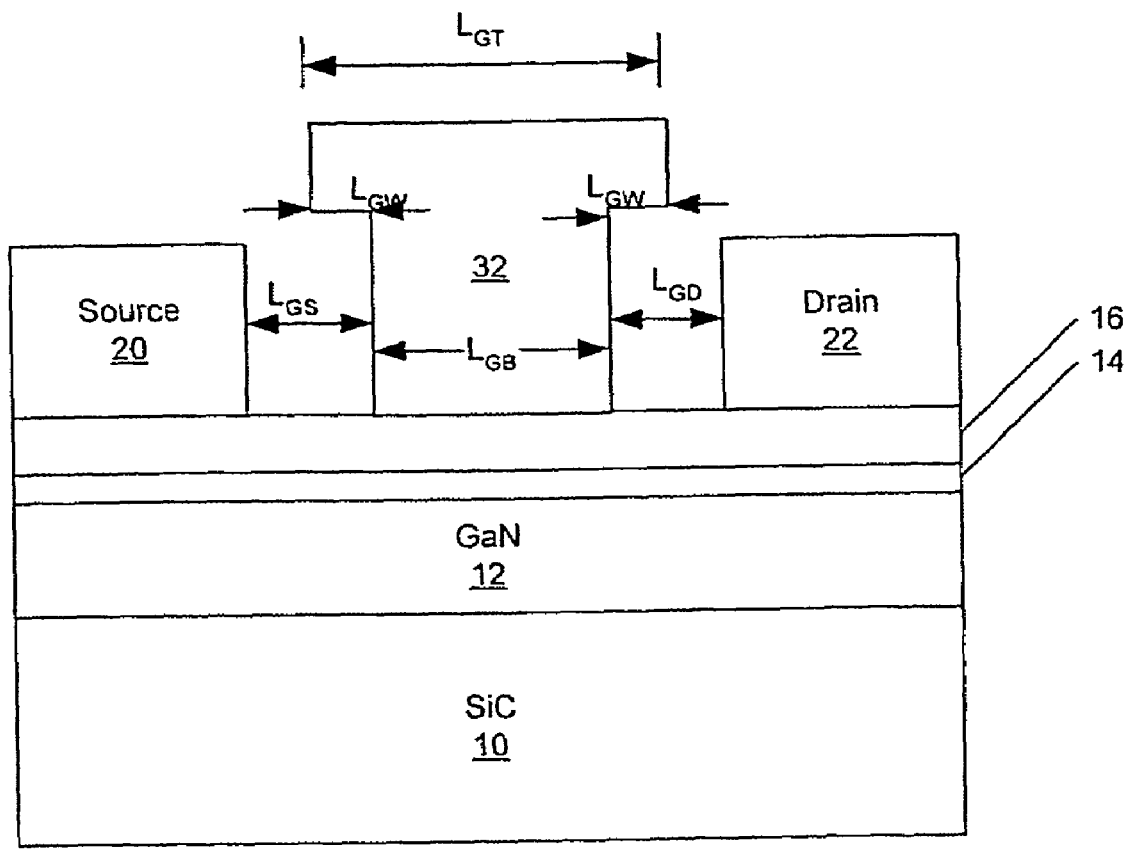
FIG. 1A is a cross-section illustrating a unit cell of transistors according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Embodiments of the present invention may be particularly well suited for use in nitride-based devices such as Group III-nitride based HEMTs. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

While embodiments of the present invention are described with reference to particular structures, other structures and/or techniques for fabricating GaN-based HEMTs could also be utilized in some embodiments of the present invention. Such structures and/or techniques may include those described, for example, in commonly assigned U.S. Pat. No. 6,316,793 and U.S. Patent Publication No. 2002/0066908A1 filed Jul. 12, 2001 and published Jun. 6, 2002, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," U.S. Pat. No. 6,849,882 to Smorchkova et al., entitled "GROUP-III NITRIDE BASED HIGH ELECTRON MOBILITY TRANSISTOR (HEMT) WITH BARRIER/SPACER LAYER", U.S. patent application Ser. No. 10/617,843 filed Jul. 11, 2003 for "NITRIDE-BASED TRANSISTORS AND METHODS OF FABRICATION THEREOF USING NON-ETCHED CONTACT RECESSES," U.S. patent application Ser. No. 10/772,882 filed Feb. 5, 2004 for "NITRIDE HETEROJUNCTION TRANSISTORS HAVING CHARGE-TRANSFER INDUCED ENERGY BARRIERS AND METHODS OF FABRICATING THE SAME," U.S. patent application Ser. No. 10/897,726, filed Jul. 23, 2004 entitled "METHODS OF FABRICATING NITRIDE-BASED TRANSISTORS WITH A CAP LAYER AND A RECESSED GATE," U.S. patent application Ser. No. 10/849,617, filed May 20, 2004 entitled "METHODS OF FABRICATING NITRIDE-BASED TRANSISTORS HAVING REGROWN OHMIC CONTACT REGIONS AND NITRIDE-BASED TRANSISTORS HAVING REGROWN OHMIC CONTACT REGIONS," U.S. patent application Ser. No. 10/849,589, filed May 20, 2004 and entitled "SEMICONDUCTOR DEVICES HAVING A HYBRID CHANNEL LAYER, CURRENT APERTURE TRANSISTORS AND METHODS OF FABRICATING SAME," U.S. Patent Publication No. 2003/0020092 filed Jul. 23, 2002 and published Jan. 30, 2003 for "INSULATING GATE ALGAN/GAN HEMT", and U.S. patent application Ser. No. 10/996,249, filed Nov. 23, 2004 and entitled "CAP LAYERS AND/OR PASSIVATION LAYERS FOR NITRIDE-BASED TRANSISTORS, TRANSISTOR STRUCTURES AND METHODS OF FABRICATING SAME," the disclosures of which are incorporated herein as if described in their entirety.

As discussed in the background of the present invention, it is standard practice to screen RF power devices with high temperature, reverse bias (HRTB) tests as part of qualification procedure. As used herein, "capable of withstanding" refers to withstanding the application of test conditions without destruction of the device, i.e., without irreversible damage that prevents operation of the device. Group III-nitride devices may be more susceptible to degradation under the HRTB conditions than many other devices. Thus, creating devices that can withstand such conditions may be difficult. Accordingly, Group III nitride devices that can withstand the HRTB conditions may be an obstacle in developing commercial Group III Nitride Field Effect Transistors (FETs), for example, high electron mobility transistors (HEMTs), products.

HRTB tests were run on several different wafer lots of Group III Nitride FETs (HEMTs). For a HEMT having a pinch off voltage of from about −3.0 to about −4.0 volts, a dc drain bias of about 28.0 volts and a corresponding maximum drain swing to as much as 56 volts was predicted. The gate voltage may swing from about 2.0 to about 3.V to from about −8 to about −10 volts. Thus, tests were performed using a drain-to-source voltage ($V_{DS}$) of 56 volts, a gate to source voltage ($V_{gs}$) of −8 or −14 volts at a normal operating temperature of 140° C. for various lengths of time. Earlier tests were run with a Vgs of −14 volts and more recent tests were run with a $V_{gs}$ of −8 volts. It will be understood that for an ideal device these tests could be run on the device for an infinite amount of time and the device would not experience any power degradation. For qualification procedures, the tests are typically run for about 1000 hours, however, because the tests were performed to determine relative differences between a large number of wafers, the tests were run for a much shorter period of time.

Figure 1B:
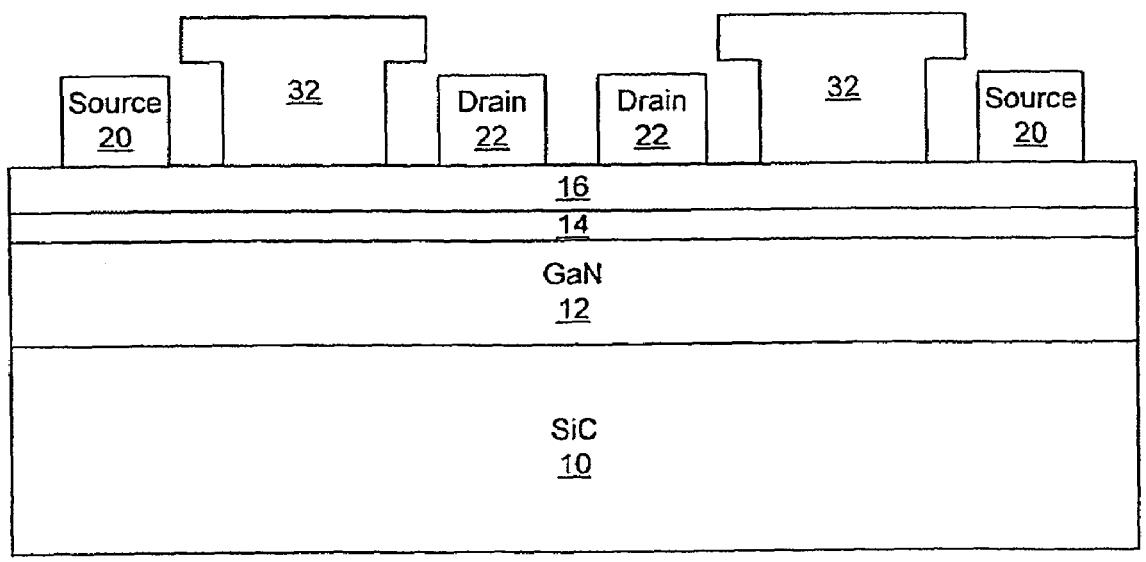
FIG. 1B is cross-section illustrating multiple unit cells according to some embodiments of the present invention.

As a preliminary note, the tests were run at both Cree's North Carolina and California facilities. Although the stresses at each facility are substantially equivalent, the results obtained by the Cree's California facility appear to be better. For example, where the California team may obtain a power degradation of about 0.4 dB, the North Carolina team may obtain a power degradation of from about 0.8 to about 0.9 dB for devices (wafers) in the same lot. As discussed above, tests using HTRB conditions for six different wafer lots were performed. The structure discussed below with respect to FIGS. 1A and 1B is a general structure of the devices tests. Specific device specifications for each of the test runs will be discussed in detail below.

As will be discussed below with respect to FIGS. 1A through 3, devices according to some embodiments of the present invention provide Group III Nitride based FETs capable of withstanding high temperature, reverse bias (HTRB) test conditions of a drain-to-source voltage ($V_{DS}$) of about 56 volts, a gate to source voltage ($V_{gs}$) of from about −8 to about −14 volts and a temperature of about 140° C. for at least about 10 hours. Furthermore, FETs according to some embodiments of the present invention not-only withstand HTRB stress con ditions, the devices discussed herein have power degradations of less than about 3.0 dB as will be discussed further below.

Exemplary devices according to some embodiments of the present invention are schematically illustrated in FIGS. 1A and 1B. However, embodiments of the present invention should not be construed as limited to the particular exemplary embodiments described herein but may include any suitable structure that provides transistor characteristics as described herein.

Referring now to FIG. 1A a substrate 10 is provided on which nitride based devices may be formed. In particular embodiments of the present invention, the substrate 10 may be a semi-insulating silicon carbide (SiC) substrate that may be, for example, 4H polytype of silicon carbide. Other silicon carbide candidate polytypes include the 3C, 6H, and 15R polytypes. The term "semi-insulating" is used descriptively rather than in an absolute sense. In particular embodiments of the present invention, the silicon carbide bulk crystal has a resistivity equal to or higher than about $1\times10^5$ Ω-cm at room temperature.

Optional buffer, nucleation and/or transition layers (not shown) may be provided on the substrate 10. For example, an AlN buffer layer may be provided to provide an appropriate crystal structure transition between the silicon carbide substrate and the remainder of the device. Additionally, strain balancing transition layer(s) may also be provided as described, for example, in commonly assigned U.S. Patent Publication No. 2003/0102482A1, filed Jul. 19, 2002 and published Jun. 5, 2003, and entitled "STRAIN BALANCED NITRIDE HETROJUNCTION TRANSISTORS AND METHODS OF FABRICATING STRAIN BALANCED NITRIDE HETEROJUNCTION TRANSISTORS," or U.S. Pat. No. 6,841,001, entitled "STRAIN COMPENSATED SEMICONDUCTOR STRUCTURES AND METHODS OF FABRICATING STRAIN COMPENSATED SEMICON- DUCTOR STRUCTURES," the disclosures of which are incorporated herein by reference as if set forth fully herein.

Appropriate SiC substrates are manufactured by, for example, Cree, Inc., of Durham, N.C., the assignee of the present invention, and methods for producing are described, for example, in U.S. Pat. Nos. Re. 34,861; 4,946,547; 5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,592,501, the contents of which are also incorporated herein by reference in their entirety.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

Referring again to FIG. 1A, a channel layer 12 is provided on the substrate 10. The channel layer 12 may be deposited on the substrate 10 using buffer layers, transition layers, and/or nucleation layers as described above. The channel layer 12 may be under compressive strain. Furthermore, the channel layer 12 and/or buffer nucleation and/or transition layers may be deposited by MOCVD or by other techniques known to those of skill in the art, such as MBE or HVPE. In some embodiments of the present invention, the GaN buffer can be Fe doped in a manner similar to that described in Heikman et aL, Appl. Phys. Lett., vol. 81, pp. 439-441, July 2002, or U.S. patent application Ser. No. 10/752,970, filed Jan. 7, 2004, entitled CO-DOPING FOR FERMI LEVEL CONTROL IN SEMI-INSULATING GROUP III NITRIDES, the disclosures of which are incorporated herein by reference as if set forth in their entirety. In devices having Fe doped GaN buffers, the GaN buffer may be partially Fe doped, provided that the Fe concentration is very low, or less than about $1\times10^{16}$ cm$^{-3}$, in the channel region, or about 0.01 μm of the top of the GaN buffer.

The channel layer 12 is a Group III-nitride, and, in particular GaN. The channel layer 12 may be undoped ("unintentionally doped") and may be grown to a thickness of from about 0.01 to about 20.0 μm, depending on the particular embodiment of the present invention. In particular embodiments of the present invention, the channel layer 12 is GaN and has a thickness from about 2.0 to about 8.0 μm as will be discussed further below with respect to the specific test runs.

A barrier layer is provided on the channel layer 12. The channel layer 12 may have a bandgap that is less than the bandgap of the barrier layer, and the channel layer 12 may also have a larger electron affinity than the barrier layer. The barrier layer may be deposited on the channel layer 12. In certain embodiments of the present invention, the barrier layer is provided by an AlN layer 14 and an AlGaN layer 16. The AlN layer 14 may have a thickness of from about 0.2 to about 2.0 nm. The AlGaN layer 16 may have a thickness of from about 10 to about 40 nm and an Al composition of from about 15 to about 30 percent. In some embodiments of the present invention, the AlGaN layer 16 may have a thickness of from about 20 to about 30 nm and an Al composition of from about 20 to about 35 percent. Examples of layers according to certain embodiments of the present invention are described in U.S. Pat. No. 6,849,882, to Smorchkova et al., entitled "GROUP-III NITRIDE BASED HIGH ELECTRON MOBILITY TRANSISTOR (HEMT) WITH BARRIER/ SPACER LAYER" the disclosure of which is incorporated herein by reference as if set forth fully herein. In particular embodiments of the present invention, the barrier layer is thick enough and has a high enough Al composition and doping to induce a significant carrier concentration at the interface between the channel layer 12 and the barrier layer through polarization effects. In particular embodiments of the present invention, the barrier layer comprises an AlN layer having a thickness of about 0.4 to about 0.8 nm and an AlGaN layer having greater than 20 percent Al and a thickness of about 20 to about 30 nm. The percentage of Al in the AlGaN layer is typically less than about 25 percent.

As further illustrated in FIG. 1A, the HEMT includes a source contact 20, a drain contact 22 and a gate contact 32 on the AlGaN layer 16. The source and drain contacts 20 and 22 can be made of different materials including but not limited to alloys of titanium, aluminum, gold or nickel. The gate contact 32 is a T-gate as illustrated in FIG. 1A and may be fabricated using conventional fabrication techniques. Suitable gate materials may depend on the composition of the AlGaN layer 16, however, in certain embodiments, conventional materials capable of making a Schottky contact to a nitride based semiconductor material may be used, such as Ni, Pt, $NiSi_x$, Cu, Pd, Cr, W and/or WSiN. Although not illustrated, in some embodiments of the present invention a passivation layer may be blanket deposited on the structure of FIG. 1A. The passivation layer may be silicon nitride (SiN). References to SiN, SiON, $SiO_x$, MgN and the like refer to stoichiometric and/or non-stoichiometric materials. The T-gate 32 may be defined by a bi-layer e-beam lithography process and has a footprint of approximately 0.18 μm.

In FIG. 1A, the distance from the gate contact 32 to the source contact 20 is indicated as $L_{GS}$. In some embodiments of the present invention, $L_{GS}$ may be about 0.7 μm. The distance from the gate contact 32 to the drain contact 22 is indicated as $L_{GD}$. In some embodiments of the present invention, $L_{GD}$ may be about 2.0 μm. The length of the T portion of the gate contact 32 is indicated as $L_{GT}$. In some embodiments of the present invention, $L_{GT}$ may be about 0.7 μm. The length of the base of the gate contact 32 is indicated as $L_{GB}$. In some embodiments of the present invention, $L_{GB}$ may be about 0.2 μm. The distance the wings of the T extend out from the base of the gate contact 32 is indicated as $L_{GW}$. In some embodiments of the present invention, the $L_{GW}$ may be about 0.25 μm. The dimension of the gate contact 32 extending into and out of the page in FIG. 1A is referred to herein as the gate width $W_G$. In some embodiments of the present invention, the $W_G$ may be about 250 μm. A total width of the device may be 30.0 mm, however, this may depend on power level and frequency. Multiple cells may be placed in parallel to increase the total width of the device. The total width may also be referred to as the "periphery" of the combined device.

HEMTs according to some embodiments of the present invention include multiple gate fingers, each having a width of about 0.25 mm. Embodiments of the present invention discussed herein include 2 gate fingers. The device has a total width of about 0.5 mm. FIG. 1B is a cross-section illustrating multiple unit cells of transistors according to some embodiments of the present invention. Like numbers in FIG. 1B refer to like elements of FIG. 1A and, therefore, details of these elements will not be discussed further herein. It will be understood that although the drains 22 are separate in FIG. 1B, the drains 22 may be combined into a single rail without departing from the scope of the present invention. The devices discussed herein may have a power density of greater than about 3.0 W/mm when operating at a frequency of from about 3.5 to about 4.0 GHz Unless indicated otherwise, the devices discussed below are devices having the above described structure. Performance of exemplary devices as described herein will now be described. However, embodiments of the present invention should not be construed as limited to these particular devices, but includes other devices capable of providing the performance characteristics described herein. Furthermore, while various theories of operation are described herein, embodiments of the present invention should not be construed as limited to a particular theory of operation.

The results obtained for six test runs will now be discussed in detail. A first series of test runs produced a power degradation ranging from about 0.07 to about 0.44 dB after stressed at high temperature, reverse bias (HTRB) conditions. The devices tested did not contain Fe doping or SiN layers discussed above with respect to FIG. 1A according to some embodiments of the present invention. The HTRB stress conditions that produced the stated power degradation were as follows: $V_{DS}$=56 volts, $V_{gs}$=−8 volts, T=140° C. and Time=20 hours. It will be understood that these values are approximate values and, therefore, embodiments of the present invention should not be limited to these exact values. Furthermore, reverse gate-to-drain leakage current decreased from about 14 to 20 microamps to just a few microamps in all cases.

A second series of test runs produced a power degradation ranging from about 0.06 to about 1.30 dB after stressed at high temperature, reverse bias (HTRB) conditions. The devices tested included Fe doping below the channel as discussed above with respect to FIG. 1A. Furthermore, the GaN buffer layers had thicknesses of from about 2.0 to about 8 μm. The HTRB stress conditions that produced the stated power degradation were as follows: $V_{DS}$=56 volts, $V_{gs}$=−8 volts, T=140° C. and Time=20 hours. Although, there was no strong correlation in the final data between buffer thickness and reliability, the best results were achieved with the thickest buffer. Thick buffers may result in defects in the surface of the device. Furthermore, gate-to-drain reverse leakage current ($I_{gd}$) decreased for some wafers and increased for others, but decreased for the wafer producing the best result.

A third series of test runs produced a power degradation ranging from less than about 0.25 to about 1.0 dB after stressed at high temperature, reverse bias (HTRB) conditions. The devices tested included SiN layers (approximately 1 monolayer) as discussed above with respect to FIG. 1A. The HTRB stress conditions that produced the stated power degradation were as follows: $V_{DS}$=56 volts, $V_{gs}$=−8 volts, T=140° C. and Time=10 hours. The devices in embodiments of the present invention without SiN layers degraded about 1.0 dB, however, several devices in embodiments of the present invention with SiN layers degraded less than about 0.25 dB under more stringent conditions and exhibited low and decreasing leakage currents.

A fourth series of test runs produced a power degradation ranging from about 0.1 to 0.4 dB after stressed at high temperature, reverse bias (HTRB) conditions. These devices had GaN buffers having a thickness of about 6 μm and varying amounts Fe doping. The Fe doping concentration ranged from about $2 \times 10^{16}$ $cm^{-3}$ to about $2 \times 10^{18}$ $cm^{-3}$. The wafer with the most doping closest to the channel produced a power degradation of from about 1.0 to about 2.0 dB. The HTRB stress conditions that produced the stated power degradation were as follows: $V_{DS}$=56 volts, $V_{gs}$=−8 volts, T=140° C. and Time=10 hours. Furthermore, reverse leakage currents, for the most part, started and remained in the 20 to 100 microamps range. One of the wafers exhibited a power degradation of about 0.4 dB in a longer test, about 62 hours. Furthermore, another wafer exhibited a power degradation of from about 0.1 dB to 0.5 dB when the $V_{gs}$ was −14 instead of −8 volts.

A fifth series of test runs produced a power degradation ranging from about 0.3 to about 1 dB after stressed at high temperature, reverse bias (HTRB) conditions. The devices had GaN buffers having a thickness of about 6 µm and varying amounts of aluminum in the AlGaN layer. The percentage of aluminum varied from about 20 to about 25 percent. The variation of aluminum did not appear to significantly impact the test results. The HTRB stress conditions that produced the stated power degradation were as follows: $V_{DS}$=56 volts, $V_{gs}$=−8 volts, T=140° C. and Time=10 hours. Modest increases in reverse leakage current were observed for the high mole fraction wafers, which also had higher charge densities, higher current levels, more power output and presumably higher internal fields. It should be noted that power degradation measured by Cree, California, varied from about 0.3 to about 0.6 dB and reverse leakage current generally increased from 0.1 mA/mm to between 0.5 and 1.0 mA/mm. Power degradation measured by Cree, North Carolina, varied from about 0.7 to 1.0 dB, possibly due to the different details of the RF testing before and after stressing.

Figure 2:
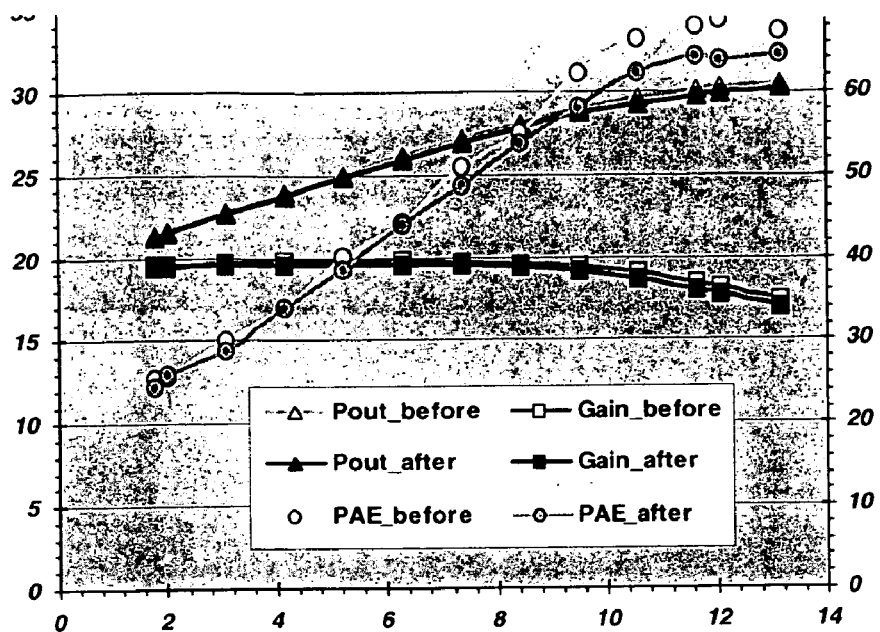
FIG. 2 is a plot illustrating Output Power (POUT), Power Added Efficiency (PAE) and Gain before and after performing tests according to some embodiments of the present invention.
Figure 3:
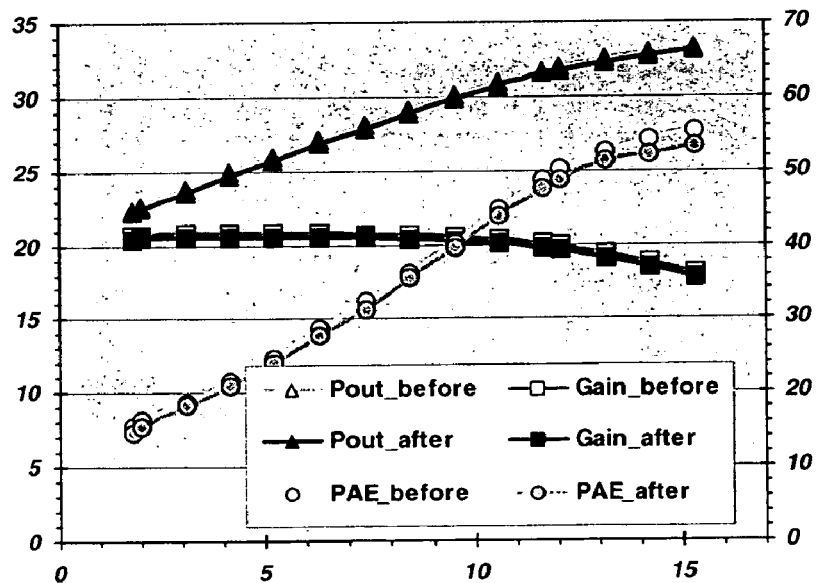
FIG. 3 is a plot illustrating Output Power (POUT), Power Added Efficiency (PAE) and Gain before and after performing tests according to further embodiments of the present invention.

Finally, a sixth series of test runs produced a power degradation ranging from about 0.0 to about 0.45 dB after stressed at high temperature, reverse bias (HTRB) conditions. The devices tested in this run had GaN buffers having a thickness of about 6 µm and varying amounts iron doping. The HTRB conditions that produced the stated power degradation were as follows: $V_{DS}$=28 to about 70 volts, $V_{gs}$=−3.3 to about −14 volts, T=140° C. and Time=less than about 100 hours. The results of these test runs are illustrated in the graphs of FIGS. 2 and 3. FIG. 2 is a plot illustrating Output Power (POUT), Power Added Efficiency (PAE) and Gain before and after performing tests according to some embodiments of the present invention when $V_{DS}$ is equal to 28V. FIG. 3 is a plot illustrating Output Power (POUT), Power Added Efficiency (PAE) and Gain before and after performing tests according to further embodiments of the present invention when $V_{DS}$ is equal to 48V.

While embodiments of the present invention have been described herein with reference to particular HEMT structures, the present invention should not be construed as limited to such structures. For example, additional layers may be included in the HEMT device while still benefiting from the teachings of the present invention. Such additional layers may include GaN cap layers, as for example, described in Yu et al., "Schottky barrier engineering in III-V nitrides via the piezoelectric effect," Applied Physics Letters, Vol. 73, No. 13, 1998, or in U.S. Pat. No. 6,584,333 filed Jul. 12, 2001, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," the disclosures of which are incorporated herein by reference as if set forth fully herein.

In the drawings and specification, there have been disclosed typical embodiments of the invention, and, although specific terms have been employed, they have been used in a generic and descriptive sense only and not for purposes of limitation.

That which is claimed is:

1. A Group III Nitride based field effect transistor (FET) having a power degradation of less than about 3.0 dB when operated at a drain-to-source voltage ($V_{DS}$) of about 56 volts, a gate to source voltage ($V_{gs}$) of from about −8 to about −14 volts and a temperature of about 140° C. for at least about 10 hours.

2. The FET of claim 1 having a power degradation of not greater than about 0.44 dB when operated at a $V_{DS}$ of about 56 volts, a $V_{gs}$ of about −8 volts and a temperature of about 140° C. for about 20 hours.

3. The FET of claim 2, comprising a GaN channel layer having a thickness of about 2.0 µm.

4. The FET of claim 3, wherein the FET is a high electron mobility transistor (HEMT) and wherein the HEMT further comprises:
an AlN layer on the GaN channel layer;
an AlGaN layer on the AlN layer;
a T- gate contact on the AlGaN layer;
an insulating layer on a surface of the HEMT; and
source and drain contacts on the AlGaN layer.

5. The FET of claim 4 having a power density of greater than about 3.0 W/mm operating at a frequency of from about 3.5 to about 4.0 GHz.

6. The FET of claim 3, wherein a distance from the T-gate contact to the source contact is about 0.7 µm, wherein a distance from the T-gate contact to the drain contact is about 2.0 µm, wherein a length of a T portion of the gate contact is about 0.7 µm and wherein a length of a base of the T-gate contact is about 0.2 µm.

7. The FET of claim 6, wherein a distance wings of the T-gate contact extend out from the base of the T-gate contact about 0.25 µm.

8. The FET of claim 2, comprising a GaN channel layer having a thickness of from about 2.0 µm to about 8.0 µm and wherein all but about 1.0 µm of a surface of the GaN channel layer is doped with Fe to a concentration of from about $2 \times 10^{16}$ cm$^{-3}$ to about $2 \times 10^{18}$ cm$^{-3}$.

9. The FET of claim 8, wherein the FET is a high electron mobility transistor (HEMT) and wherein the HEMT further comprises:
an AlN layer on the GaN channel layer;
an AlGaN layer on the AlN layer;
a T- gate contact on the AlGaN layer;
an insulating layer on a surface of the HEMT; and
source and drain contacts on the AlGaN layer.

10. The FET of claim 9 having a power density of greater than about 3.0 W/mm operating at a frequency of from about 3.5 to about 4.0 GHz.

11. The FET of claim 1 having a power degradation of not greater than about 1.3 dB when operated at a $V_{DS}$ of about 56 volts, a $V_{gs}$ of about −8 volts and a temperature of about 140° C. for about 20 hours.

12. The FET of claim 1 having a power degradation of not greater than about 0.25 dB when operated at a $V_{DS}$ of about 56 volts, a $V_{gs}$ of about −8 volts and a temperature of about 140° C. for about 10 hours.

13. The FET of claim 12, comprising a passivation layer on a surface of the FET, the passivation layer including silicon nitride (SiN).

14. The FET of claim 13, wherein the FET is a high electron mobility transistor (HEMT) and wherein the HEMT further comprises:
a GaN channel layer;
an AlN layer on the GaN channel layer;
an AlGaN layer on the AlN layer;
a T- gate contact on the AlGaN layer; and
source and drain contacts on the AlGaN layer, wherein the passivation layer is provided on the T-gate contact, the AlGaN layer and the source and drain contacts.

15. The FET of claim 14 having a power density of greater than about 3.0 W/mm operating at a frequency of from about 3.5 to about 4.0 GHz.

16. The FET of claim 1 having a power degradation of not greater than about 0.40 dB when operated at a $V_{DS}$ of about 56 volts, a $V_{gs}$ of from about −8 volts to about −14 volts and a temperature of about 140° C. for from about 10 to about 62 hours.

17. The FET of claim 16, comprising a GaN channel layer having a thickness of about 6.0 μm and wherein all but about 1.0 μm of a surface of the GaN channel layer is doped with Fe to a concentration of from about $2\times10^{16}$ cm$^{-3}$ to about $2\times10^{18}$ cm$^{-3}$.

18. The FET of claim 17, wherein the FET is a high electron mobility transistor (HEMT) and wherein the HEMT further comprises:
   an AlN layer on the GaN channel layer;
   an AlGaN layer on the AlN layer;
   a T- gate contact on the AlGaN layer;
   an insulating layer on a surface of the HEMT; and
   source and drain contacts on the AlGaN layer.

19. The FET of claim 18 having a power density of greater than about 3.0 W/mm operating at a frequency of from about 3.5 to about 4.0 GHz.

20. The FET of claim 1 having a power degradation not greater than about 1.0 dB when operated at a $V_{DS}$ of about 56 volts, a $V_{gs}$ of about −8 volts to and a temperature of about 140° C. for about 10 hours.

21. The FET of claim 20, comprising:
   a GaN channel layer having a thickness of about 6.0 μm; and
   an AlGaN layer on the GaN channel layer, having from about 15 to about 30 percent Al and a thickness of from about 15 to about 40 nm.

22. The FET of claim 21, wherein the FET is a high electron mobility transistor (HEMT) and wherein the HEMT further comprises:
   an AlN layer between the GaN channel layer and the AlGaN;
   a T- gate contact on the AlGaN layer;
   an insulating layer on a surface of the HEMT; and
   source and drain contacts on the AlGaN layer.

23. The FET of claim 22 having a power density of greater than about 3.0 W/mm operating at a frequency of from about 3.5 to about 4.0 GHz.

24. The FET of claim 1 having a power degradation of not greater than about 0.45 dB when operated at a $V_{DS}$ of from about 28 to about 70 volts, a $V_{gs}$ of about −3.3 to about −14 and a temperature of about 140° C. for about 6 to about 100 hours.

25. The FET of claim 24, comprising a GaN channel layer having a thickness of about 6.0 μm and wherein all but about 1.0 μm of a surface of the GaN channel layer is doped with Fe to a concentration of from about $2\times10^{16}$ cm$^{-3}$ to about $2\times10^{18}$ cm$^{-3}$.

26. The FET of claim 25, wherein the FET is a high electron mobility transistor (HEMT) and wherein the HEMT further comprises:
   an AlN layer on the GaN channel layer;
   an AlGaN layer on the AlN layer;
   a T- gate contact on the AlGaN layer;
   an insulating layer on a surface of the HEMT; and
   source and drain contacts on the AlGaN layer.

27. The FET of claim 26 having a power density of greater than about 3.0 W/mm operating at a frequency of from about 3.5 to about 4.0 GHz.

28. A Group III Nitride based field effect transistor (FET) capable of withstanding high temperature, reverse bias test conditions of a drain-to-source voltage ($V_{DS}$) of about 56 volts, a gate to source voltage ($V_{gs}$) of from about −8 to about −14 volts and a temperature of about 140° C. for at least about 10 hours.

29. The FET of claim 28 having a power density of greater than about 3.0 W/mm operating at a frequency of from about 3.5 to about 4.0 GHz.

30. The FET of claim 28, wherein the FET comprises a high electron mobility transistor (HEMT) and wherein the HEMT further comprises:
   a GaN Channel layer;
   an AlN layer on the GaN channel layer;
   an AlGaN layer on the AlN layer;
   a T- gate contact on the AlGaN layer;
   an insulating layer on a surface of the HEMT; and
   source and drain contacts on the AlGaN layer.

31. The FET of claim 30, wherein the GaN channel layer has a thickness of about 2.0 μm.

32. The FET of claim 30, wherein the GaN channel layer has a thickness of from about 2.0 μm to about 8.0 μm and wherein all but about 1.0 μm of the GaN channel layer is doped with Fe to a concentration of from about $2\times10^{16}$ cm$^{-3}$ to about $2\times10^{18}$ cm$^{-3}$.

33. The FET of claim 30, wherein the insulating layer comprises a passivation layer including silicon nitride (SiN).

34. The FET of claim 30, wherein the GaN channel layer has a thickness of about 6.0 μm and wherein about 5.0 μm of the GaN channel layer is doped with Fe to a concentration of from about $2\times10^{16}$ cm$^{-3}$ to about $2\times10^{18}$ cm$^{-3}$.

35. The FET of claim 30, wherein the GaN channel layer has a thickness of about 6.0 μm and wherein the AlGaN layer has from about 15 to about 30 percent Al and a thickness of from about 15 to about 40 nm.

36. A high electron mobility transistor (HEMT) having a power degradation of less than about 3.0 dB and a power density of greater than about 3.0 W/mm when operated at a drain-to-source voltage ($V_{DS}$) of about 56 volts, a gate to source voltage ($V_{gs}$) of from about −8 to about −14 volts and a temperature of about 140° C. for at least about 10 hours.

37. The HEMT of claim 36 having a power degradation of not greater than about 0.44 dB when operated at a $V_{DS}$ of about 56 volts, a $V_{gs}$ of about −8 volts and a temperature of about 140° C. for about 20 hours, wherein the HEMT comprises a GaN channel layer having a thickness of about 2.0 μm.

38. The HEMT of claim 36 having a power degradation of not greater than about 1.3 dB when operated at a $V_{DS}$ of about 56 volts, a $V_{gs}$ of about −8 volts and a temperature of about 140° C. for about 20 hours, wherein the HEMT comprises a GaN channel layer having a thickness of from about 2.0 μm to about 8 μm and wherein all but about 1.0 μm of a surface of the GaN channel layer is doped with Fe to a concentration of from about $2\times10^{16}$ cm$^{-3}$ to about $2\times10^{18}$ cm$^{-3}$.

39. The HEMT of claim 36 having a power degradation of not greater than about 0.25 dB when operated at a $V_{DS}$ of about 56 volts, a $V_{gs}$ of about −8 volts and a temperature of about 140° C. for about 10 hours, wherein the HEMT comprises a passivation layer on a surface of the HEMT, the passivation layer including silicon nitride (SiN).

40. The HEMT of claim 36 having a power degradation of not greater than about 0.40 dB when operated at a $V_{DS}$ of about 56 volts, a $V_{gs}$ of from about −8 volts to about −14 volts and a temperature of about 140° C. for from about 10 to about 62 hours, the HEMT comprising a GaN channel layer having a thickness of about 6.0 μm and wherein about but about 1.0 μm of the GaN channel layer is doped with Fe to a concentration of from about $2\times10^{16}$ cm$^{-3}$ to about $2\times10^{18}$ cm$^{-3}$.

41. The HEMT of claim 36, having a power degradation of not greater than about 0.25 dB when operated at a $V_{DS}$ of about 56 volts, a $V_{gs}$ of about −8 volts to and a temperature of about 140° C. for about 10 hours, wherein the HEMT comprises:

a GaN channel layer having a thickness of about 6.0 µm; and an AlGaN layer on the GaN channel layer, having from about 15 to about 30 percent Al and a thickness of from about 15 to about 40 nm.

42. The HEMT of claim 36 having a power degradation of not greater than about 0.45 dB when operated at a $V_{DS}$ of from about 28 to about 70 volts, a $V_{gs}$ of about −3.3 to about −14 and a temperature of about 140° C. for about 6 to about 100 hours, wherein the HEMT comprises a GaN channel layer having a thickness of about 6.0 µm and wherein all but about 1.0 µm of the GaN channel layer is doped with Fe to a concentration of from about $2 \times 10^{16}$ cm$^{-3}$ to about $2 \times 10^{18}$ cm$^{-3}$.

* * * * *

UNITED STATES PATENT AND TRADEMARK OFFICE
CERTIFICATE OF CORRECTION

PATENT NO.       : 7,465,967 B2                                          Page 1 of 1
APPLICATION NO.  : 11/080905
DATED            : December 16, 2008
INVENTOR(S)      : Smith et al.

It is certified that error appears in the above-identified patent and that said Letters Patent is hereby corrected as shown below:

In the Claims:

Column 11, Claim 1, Line 65:   Please correct "($V_{gs)}$)"
                               To read -- ($V_{gs}$) --

Column 12, Claim 4, Line 10:   Please correct "ALN"
                               To read -- AlN --

Column 14, Claim 28, Line 1:   Please correct "($V_{gs)}$)"
                               To read -- ($V_{gs}$) --

Column 14, Claim 36, Line 38:  Please correct "($V_{gs)}$)"
                               To read -- ($V_{gs}$) --

Signed and Sealed this

Twenty-fourth Day of February, 2009

JOHN DOLL
*Acting Director of the United States Patent and Trademark Office*